(12) United States Patent
Martel et al.

(10) Patent No.: US 8,417,005 B1
(45) Date of Patent: Apr. 9, 2013

(54) METHOD FOR AUTOMATIC THREE-DIMENSIONAL SEGMENTATION OF MAGNETIC RESONANCE IMAGES

(75) Inventors: Anne L Martel, Toronto (CA); Cristina Gallego, Toronto (CA)

(73) Assignee: Sunnybrook Health Sciences Centre, Toronto (CA)

( * ) Notice: Subject to any disclaimer, the term of this patent is extended or adjusted under 35 U.S.C. 154(b) by 26 days.

(21) Appl. No.: 13/233,570

(22) Filed: Sep. 15, 2011

(51) Int. Cl.
*G06K 9/00* (2006.01)
*G01N 23/00* (2006.01)

(52) U.S. Cl. .......................................... 382/128; 378/1

(58) Field of Classification Search .................. None
See application file for complete search history.

(56) References Cited

U.S. PATENT DOCUMENTS

| | | | |
|---|---|---|---|
| 5,930,384 A * | 7/1999 | Guillemaud et al. | 382/154 |
| 6,167,155 A * | 12/2000 | Kostrzewski et al. | 382/232 |
| 6,330,523 B1 * | 12/2001 | Kacyra et al. | 702/159 |
| 6,658,142 B1 * | 12/2003 | Agard et al. | 382/130 |
| 6,879,711 B2 * | 4/2005 | Maurincomme et al. | 382/128 |
| 6,963,662 B1 * | 11/2005 | LeClerc et al. | 382/154 |
| 7,194,117 B2 * | 3/2007 | Kaufman et al. | 382/128 |
| 7,224,824 B1 * | 5/2007 | Kam et al. | 382/128 |
| 7,274,810 B2 * | 9/2007 | Reeves et al. | 382/128 |
| 7,353,153 B2 * | 4/2008 | Ascenzi et al. | 703/11 |
| 7,355,597 B2 * | 4/2008 | Laidlaw et al. | 345/419 |
| 7,474,776 B2 * | 1/2009 | Kaufman et al. | 382/128 |
| 7,970,194 B2 * | 6/2011 | Kimura | 382/131 |
| 8,045,770 B2 * | 10/2011 | Reeves et al. | 382/128 |
| 2012/0189175 A1 * | 7/2012 | Highnam et al. | 382/128 |

* cited by examiner

*Primary Examiner* — Manav Seth
(74) *Attorney, Agent, or Firm* — Quarles & Brady, LLP

(57) ABSTRACT

A method for automatically segmenting a volume-of-interest representative of a subject's breast from a three-dimensional magnetic resonance image is provided. The three-dimensional image may include a plurality of spatially contiguous two-dimensional images. The image is converted to a monogenic signal, which is analyzed to determine locations in the image that correspond to maximal phase congruency in the monogenic signal. The orientation of each of these locations is determined and used along with the locations to estimate a boundary surface of the volume-of-interest. The estimated surface may be used to segment the image directly, or to generate a surface model, such as a statistical shape model, that is used to segment the image. This provided method is robust to segmenting the subject's breast, even at the chest-wall boundary in images with lower contrast-to-noise ratio between breast tissue and tissues in and around the chest wall.

21 Claims, 3 Drawing Sheets

METHOD FOR AUTOMATIC
THREE-DIMENSIONAL SEGMENTATION OF
MAGNETIC RESONANCE IMAGES

BACKGROUND OF THE INVENTION

The field of the invention is systems and methods for magnetic resonance imaging ("MRI"). More particularly, the invention relates to systems and methods for automatically segmenting images acquired with an MRI system, such as images of the breast.

Breast cancer is currently the most common diagnosed cancer among women and a significant cause of death. Breast density, a representation of the amount of dense parenchyma present in the breast, has been identified as a significant risk factor for developing breast cancer. Although the majority of epidemiological evidence on breast density as a risk factor comes from x-ray mammography screening data, some researchers have acknowledged the advantages of studying breast density with different imaging modalities, such as MRI. MRI is a versatile imaging modality that provides a three-dimensional view of the breast for volumetric breast density assessment without the risks from exposure to ionizing radiation.

However, quantitative evaluation of breast density using MRI suffers from several limitations, including inconsistent breast boundary segmentation and lack of standardized algorithms to accurately measure breast density. It is desirable to have consistent and robust computer-aided analysis tools to segment the breast and to extract the total volume of the breast in three dimensions.

For quantitative assessment of breast density using MRI, separate images of breast water and fat can be obtained and breast water can be measured as a surrogate for fibroglandular tissue and stroma. However, with these techniques, breast segmentation is further necessary to remove background noise artifacts and exclude surrounding muscle tissues in the chest wall. Robust and reliable automatic segmentation is, therefore, desired. In breast MRI, image intensity distributions are dependent on the selected MRI scanning protocol and acquisition parameters; thus, segmentation based on the separation of grayscale intensities, such as selective thresholding, is inadequate and lacks generalization when used with different scanning protocols. In addition, the contrast between the breast and adjacent structures, such as pectoral muscles, is not distinctively defined.

It is therefore desired to provide a method for segmenting breast tissue from a three-dimensional image acquired with MRI, in which the segmentation does not rely on grayscale intensity differences in the image, and in which images acquired with different scanning protocols can be similarly segmented for reliable comparisons.

SUMMARY OF THE INVENTION

The present invention overcomes the aforementioned drawbacks by providing a method for segmenting a volume-of-interest, such as a subject's breast, from a three-dimensional magnetic resonance image by converting the three-dimensional image to a monogenic signal, from which grayscale intensity independent measures of the boundary of the volume-of-interest can be determined.

It is an aspect of the invention to provide a method for automatically segmenting a three-dimensional image depicting a subject, the three-dimensional image being acquired with a magnetic resonance imaging ("MRI") system. Image data is acquired from the subject using the MRI system, and a three-dimensional image depicting the subject and a volume-of-interest to be segmented is reconstructed from that image data. The three-dimensional image may include a plurality of spatially contiguous two-dimensional images, and the volume-of-interest may represent a subject's breast. From the three-dimensional image, a monogenic signal that represents the three-dimensional image is produced. This monogenic signal is analyzed to determine locations in the three-dimensional image that correspond to points of maximal phase congruency. An orientation of each of the points of maximal phase congruency is estimated and used along with the points of maximal phase congruency to estimate a surface of the volume-of-interest. The three-dimensional image is then segmented using the estimated surface of the volume of interest. Likewise, the estimated surface may be used to generate a statistical shape model of the volume-of-interest, and this statistical shape model may be used to segment the three-dimensional image.

It is another aspect of the invention to provide a method for automatically segmenting a volume-of-interest representative of a subject's breast from a magnetic resonance image. The image may include a three-dimensional image or a plurality of spatially contiguous two-dimensional images. The image is provided and then converted into a monogenic signal. Locations in the monogenic signal that correspond to locations in the image that have maximal phase congruency are determined, as is the orientation of each of the locations in the image having maximal phase congruency. A boundary surface of the volume-of-interest to be segmented is then estimated using the locations in the image that have maximal phase congruency and the determined orientation of each of the locations in the image having maximal phase congruency. The volume-of-interest may then be segmented from the image using the estimated boundary surface.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

A system and method for automatically segmenting a volume-of-interest from a three-dimensional magnetic resonance image is provided. An example of a desired volume-of-interest is a patient's breast. While reference is made herein to processing a three-dimensional image, it should be appreciated by those skilled in the art that a three-dimensional image volume may also include a plurality of contiguous two-dimensional images. Generally, a Poisson-Laplacian framework for such a segmentation is provided. Phase congruency is employed for detecting the edges of the desired volume-of-interest, and is useful for this purpose because it is invariant to image intensity variations and inhomogeneities. A Poisson surface reconstruction followed by a Laplacian surface mapping framework may be used to segment the volume-of-interest. In addition, these steps may be used to initialize segmentation using a three-dimensional statistical shape model ("SSM"). While the succeeding description is provided with respect to segmenting a magnetic resonance image, the method is also applicable to other medical imaging modalities, including x-ray computed tomography and x-ray tomosynthesis.

Figure 1:
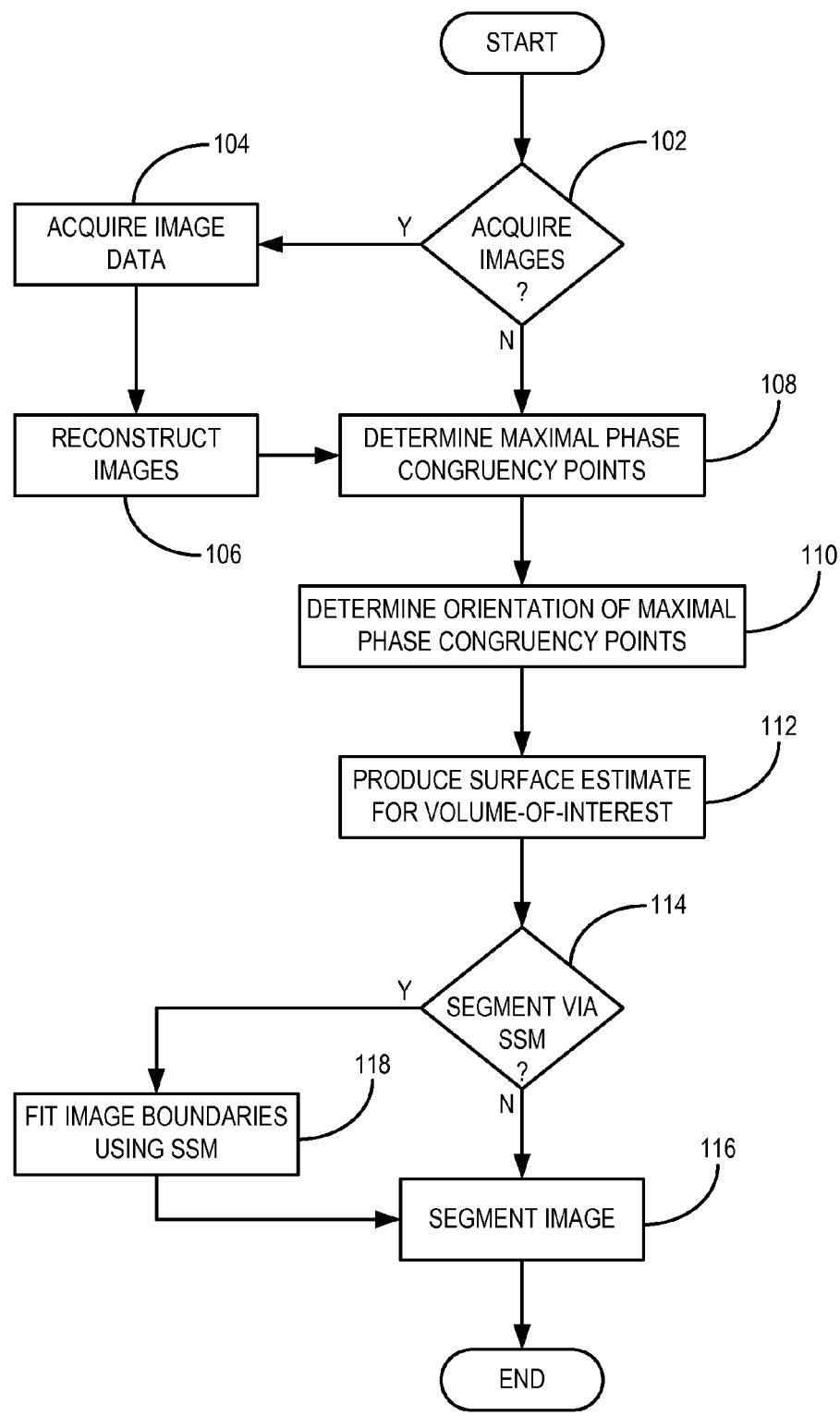
FIG. 1 is a flowchart setting forth the steps of an example of a method for automatically segmenting a three-dimensional magnetic resonance image in accordance with embodiments of the invention.

Referring now to FIG. 1, a flowchart setting forth the steps of an example of a method for automatically segmenting a three-dimensional magnetic resonance image is illustrated. A determination is made as decision block 102 as to whether an image of the subject should be acquired. If so, the method optionally begins with the acquisition of image data, as indicated at step 104, and the reconstruction of one or more images to be segmented, as indicated at step 106. In the alternative, however, the method may operate by processing preexisting images.

In general, image data is obtained as k-space data by directing the MRI system to sample nuclear magnetic resonance ("NMR") echo signals in k-space. By way of example, the MRI system may be directed to perform a fast-spin-echo ("FSE") pulse sequence to acquire k-space data. In the alternative, other pulse sequences may be employed to acquire k-space data. The MRI system may be directed to perform an FSE or other pulse sequence in accordance with Dixon imaging techniques, in which k-space data is acquired by sampling a plurality of different echo signals that are formed at a corresponding plurality of different echo times. For example, in three-point Dixon imaging techniques, k-space data is acquired from three different echo signals that are formed at three different echo times. By way of example, the three k-space data sets, corresponding to each of the three different echo times, may be acquired such that water and fat signals contain relative phase shifts of 0, π, and 2π. The images corresponding to the zero degree phase shift and to the 2π degree phase shift correspond to images where both the fat and water signals are in phase. When employing such Dixon imaging techniques, one of these in-phase images may be used for the segmentations described herein. It will be appreciated by those skilled in the art that images with different contrast characteristics may be similarly acquired with different pulse sequences and segmented in accordance with the methods described herein.

The segmentation of a three-dimensional image begins with the determination of maximal phase congruency points in the image, as indicated at step 108. Phase congruency can be calculated in two-dimensions via a bank of oriented filters to obtain local phase information at a given spatial location. However, computing phase congruency in three-dimensions using a bank of filters is a computationally complex and difficult task because it requires defining a number of appropriate filter orientations and their angular spread to evenly cover the entire image spectrum. To overcome this complexity and computational burden, the present invention operates by detecting points of maximal phase congruency as points of maximal local energy. Maximal local energy, which identifies points of maximal phase congruency, may be estimated by analyzing a monogenic signal representation of the images being processed. In general, a monogenic signal is an isotropic extension of the one-dimensional analytic signal to higher dimensions via vector-value odd filters. Phase congruency may be calculated, for example, by analyzing the Fourier series of the monogenic signal representation of the three-dimensional image. By way of example, phase congruency may be calculated by determining maxima in the local energy function. The monogenic signal may be formed, for example, by convolving the original log-Gabor filtered three-dimensional image with the components of a Riesz filter. The monogenic signal may then be used for the computation of the local energy function, E(x), which may be defined as:

$$E(x) = \sqrt{F_{M1}^2 + F_{M2}^2 + F_{M3}^2 + F_{M4}^2} \quad (1)$$

where $F_{Mi}$, i=1,2,3,4 is each of the monogenic signal components. Using the local energy function, E(x), the points of maximal phase congruency can be determined through the following relationship:

$$PC(x) = \frac{E(x)}{\sum_n A_n}; \quad (2)$$

where $A_n$ is the amplitude of the $n^{th}$ Fourier component of the signal, and PC(x) is the phase congruency at a point, x. Because the local energy function is directly proportional to the phase congruency function, peaks in local energy will correspond to peaks in phase congruency. A noise threshold, T, may also be applied to the computation of phase congruency. This noise threshold may be calculated as the mean noise response plus some multiple, k, of the standard deviation of the local energy distribution as:

$$T = \mu + k\sigma, \ k=2 \quad (3);$$

where μ is the mean and σ is the standard deviation of the local energy distribution. The noise threshold, T, is subtracted from the local energy before normalizing it by the sum of signal amplitudes. After this, the phase congruency may be $$PC(x) = \frac{|E(x) - T|}{\sum_n A_n + \varepsilon}; \quad (4)$$

where ε is a small positive constant that is used to avoid division by zero. Phase congruency is also weighted by the spread of frequencies; thus, features are generally detected at a significant distribution of frequencies. A measure of filter response spread can be generated by taking the sum of the amplitudes of the responses and dividing by the highest individual response to obtain the "width" of the distribution. After this, phase congruency may be given by:

$$PC(x) = \frac{W(x) \cdot |E(x) - T|}{\sum_n A_n + \varepsilon}; \quad (5)$$

where W(x) is a weighting function that penalized phase congruency responses with a narrow frequency spread.

Thus, as an example, points of maximal phase congruency may be calculated by transforming the three-dimensional image into a one-dimensional monogenic signal, calculating the local energy maxima of that monogenic signal representation of the image, and then determining the points of maximal phase congruency from those local energy maxima. An example of how the points of maximal phase congruency is explained in further detail below with respect to FIG. 2.

Once the points of maximal phase congruency have been determined, they are processed to determine their orientation, as indicated at step 110. By way of example, the orientation of these points may be determined by sampling the image gradient at the maximal phase congruency point locations. These sample points, which have a specific orientation attributed to them, may be considered as samples of an implicit indicator function, X, whose gradient best approximates a vector field, $\vec{V}$, defined by the point normals, such as:

$$\min_{\chi} \|\nabla_{\chi} - \vec{V}\|. \quad (6)$$

This variational problem can be transformed into a Poisson problem where finding the best solution involves computing a least-squared approximate solution of the scalar function, $\chi$, whose Laplacian equals the divergence of the vector field:

$$\Delta\chi = \nabla^2\chi = \nabla \cdot \vec{V} \quad (7).$$

As an example, the scalar function, $\chi$, may be represented in an adaptive octree, and the Poisson equation may be solved in successive, well-conditioned sparse linear systems at multiple octree depths.

There may be instances where insufficient image contrast between the volume-of-interest and the areas surrounding the volume-of-interest to allow for reliable determination of the maximal phase congruency point orientations by way of image gradient analysis. For example, when the image being segmented is a $T_1$-weighted image of the breast, there may be insufficient image contrast between the breast tissue to be segmented and muscles in the chest wall. In this instance, at the air-breast boundary, the inward normals of a reconstructed surface from an air-background thresholding operation may be analyzed to provide orientation information for the maximal phase congruency points along those boundaries. At the chest-wall boundary, the same approach may be applied, but instead of thresholding the original image, the maximal phase congruency image can be used to estimate chest-wall region surface normals. In this way, the orientation information of the maximal phase congruency points corresponding to the chest-wall boundary can be determined.

Using the determined points of maximal phase congruency and information about their orientation, a surface of a volume-of-interest to be segmented is estimated, as indicated at step 112. For example, an isocontour may be defined using the points of maximal phase congruency and their orientation. Points of maximal phase congruency coincide with features of high edge strength and, therefore, can be interpreted as sample points from a field of edge potential. Points of maximal phase congruency may be sampled with the purpose of estimating a volume-of-interest boundary isosurface using, for example, a Poisson surface reconstruction. In this manner, the topology of an unknown surface can be inferred given oriented points located on or near the surface. By way of example, when the orientation of the maximal phase congruency points is provided by a scalar function, $\chi$, the surface corresponding to the volume-of-interest boundary can be extracted as an isocontour of $\chi$ using, for example, an adaptive marching cubes algorithm. An example of such an algorithm is described by J. Wilhelms, et al., in "Octrees for Faster Isosurface Generation," *ACM Transactions on Graphics*, 1992; 11(3):201-227. This surface reconstruction algorithm performs best with sufficiently dense point samples and copes well with missing data by filling small holes.

A determination is then made at decision block 114 whether the estimated boundary surface should be refined further using statistical shape model-based segmentation, or whether it should be used alone to segment the image. If statistical shape model-based segmentation is not desired, then segmentation of the image occurs using the estimated surface boundary, as indicated at step 116. In some instances, it may be desirable to further refine the estimated boundary surface. In these instances, the estimated boundary surface may be used as initialization for a subsequent model-based segmentation. For example, the mean of a population of three-dimensional landmarked boundary surface shapes, $S_{mean}$, can be initialized to the generated boundary surface estimate, $S_{estimate}$. The mean surface shape, $S_{mean}$, may be obtained from a population of boundary surface shapes using group-wise registration. First, both surfaces are bought into the same reference frame using, for example, a landmark-based rigid registration that starts by aligning the centroids of the population shape atlas and the generated boundary surface estimate. Then, mapping three-dimensional landmarks from the mean surface to the estimated boundary surface can be treated as a correspondence problem. This problem may be formulated using a Laplacian equation, such as:

$$\nabla^2 \psi = \frac{\partial^2 \psi}{\partial x^2} + \frac{\partial^2 \psi}{\partial y^2} + \frac{\partial^2 \psi}{\partial z^2} = 0; \quad (8)$$

with boundary conditions $\psi = \psi_1$ on $S_{mean}$, and $\psi = \psi_2$ on $S_{estimate}$, where $(\psi_1, \psi_2)$ are two different fixed potentials. The solution to the Laplace equation in Eqn. (8) is a scalar field, $\psi$, that provides a transition from the mean surface, $S_{mean}$, to the estimated boundary surface, $S_{estimate}$, as defined by a set of nested surfaces. Furthermore, given the geometric properties of the Laplace equation of Eqn. (8), a unit vector field, N, that defines field lines connecting both surfaces, also known as streamlines, can be calculated by computing the normalized negative gradient of the Laplace solution:

$$N = -\frac{\nabla \psi}{\|\nabla \psi\|}; \quad (9)$$

The path between two corresponding points, such as the path connecting $p_1$ on $S_{mean}$ and $p_2$ on $S_{estimate}$, can be found by following the streamline in a ray casting approach, starting at the mean surface in the direction of the unit vector field, N.

If, on the other hand, a statistical shape model is employed for statistical shape model-based segmentation, then the Laplacian initialized mean surface, $S_{mean}$, to the estimated boundary surface, $S_{estimate}$, is utilized as a starting point for fitting a statistical shape model to the image boundaries, as indicated at step 118. This fitted statistical shape model may then be used to segment the image, as indicated again at step 116.

Figure 2:
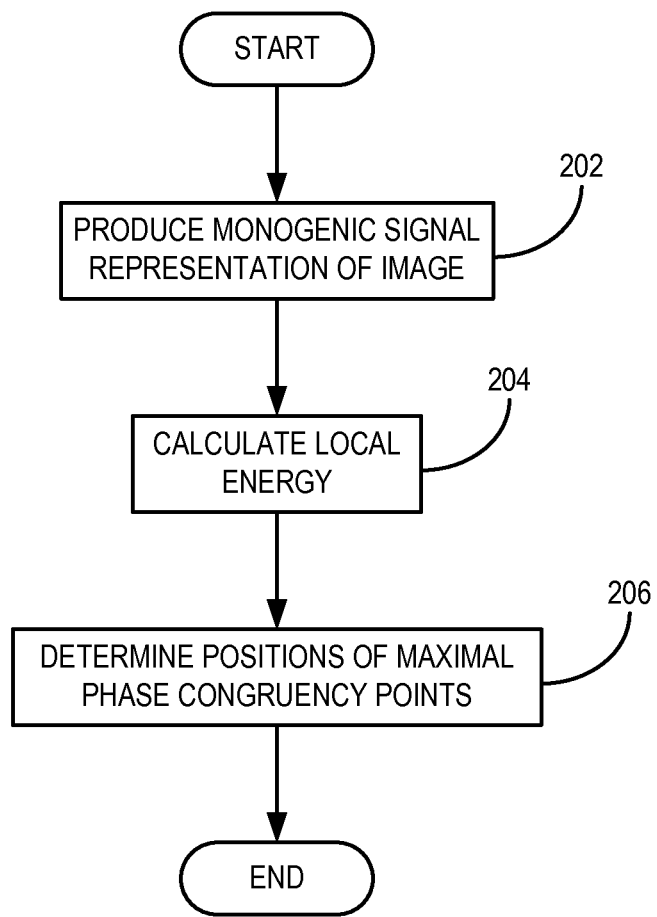
FIG. 2 is a flowchart setting forth the steps of an example of a method for determining points of maximal phase congruency in a three-dimensional image in accordance with embodiments of the invention.

Referring now to FIG. 2, a flowchart setting forth the steps of an example of a method for determining points of maximal phase congruency in a three-dimensional image is illustrated. The method begins with the transformation of the three-dimensional image into a monogenic signal representation of the image, as indicated at step 202. By way of example, a monogenic signal representation of a three-dimensional image may be obtained by convolving the image with an appropriate transform operator, such as the Riesz transform. In practice, the infinite impulse response of the Riesz transform may be reduced by first convolving the image with a bandpass filter, such as the log-Gabor function:

$$G(\omega) = \exp\left(-\frac{\ln\left(\frac{\omega}{\omega_0}\right)^2}{2\ln\left(\frac{k}{\omega_0}\right)^2}\right); \quad (10)$$

Where $\omega_0$ is the center frequency of the filter, k is a scaling factor that scales the filter bandwidth, and $k/\omega_0$ is the ratio of the spread of the Gaussian describing the log-Gabor transfer function in the frequency domain to the filter center frequency. The ratio, $k/\omega_0$ is generally kept constant to produce filters with equal bandwidths at different scales.

The log-Gabor response and the log-Gabor filtered Riesz kernel responses are a quadrature pair of filters that may be applied to different scales and the results summed over all scales. In contrast to the bank of oriented filters approach, there is no need for an additional summation along different orientations. The filters may be adjusted for different scales by modifying the center frequency of the filters. The center frequency at a given scale, s, may be determined by the following equation:

$$\omega_s = \frac{1}{\lambda_{min}(\delta)^{s-1}}, s = 1, 2, \ldots, n; \quad (11)$$

where $\lambda_{min}$ is the smallest wavelength of the log-Gabor filter and is a scaling factor between successive scales. This wavelength, $\lambda_{min}$, is scaled up to the total number of scales, n.

After the monogenic signal has been generated, it is processed to calculate the local energy at points in the signal, as indicated at step 204. The points of maximal local energy in the signal correspond to the points of maximal phase congruency through the relationship noted in Eqn. (2) above; thus, the positions of the maximal phase congruency points can be determined from the calculated local energy function, as indicated at step 206.

When the foregoing method is used to segment a volume-of-interest corresponding to a patient's breast, the method allows for a more reliable measurement of the density of the breast tissue because the breast tissue is more accurately segmented from the chest wall and other adjacent tissues. Furthermore, the segmented breast volume may be used to improve the efficacy of computer-aided diagnosis ("CAD") systems and also for general visualization uses, such as for providing a radiologist with a depiction of the segmented breast volume.

Figure 3:
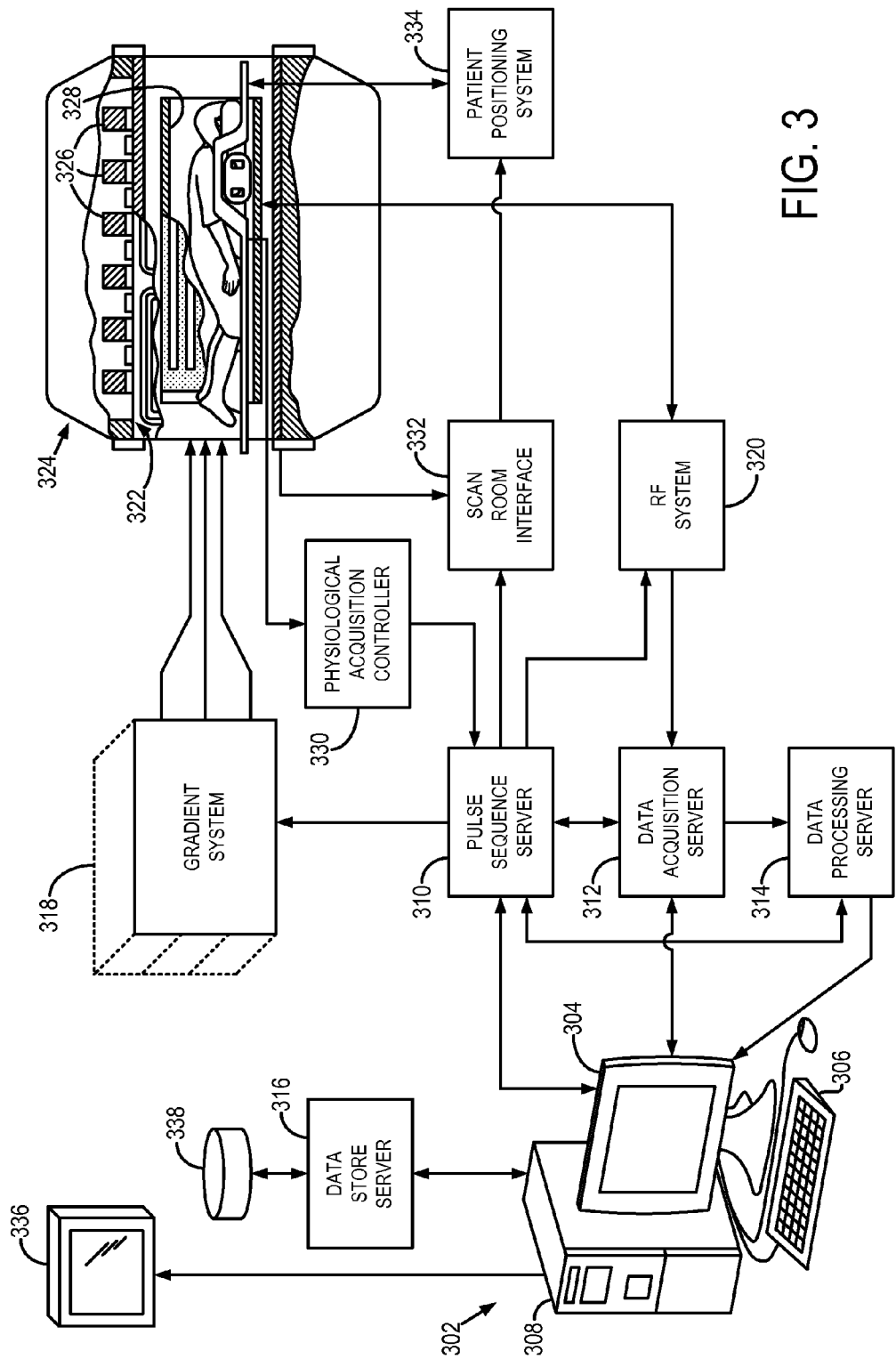
FIG. 3 is a block diagram of an example of a magnetic resonance imaging ("MRI") system.

Referring particularly now to FIG. 3, an example of a magnetic resonance imaging ("MRI") system 300 is illustrated. The MRI system 300 includes a workstation 302 having a display 304 and a keyboard 306. The workstation 302 includes a processor 308, such as a commercially available programmable machine running a commercially available operating system. The workstation 302 may provide an operator interface that enables scan prescriptions to be entered into the MRI system 300. The workstation 302 is coupled to four servers: a pulse sequence server 310; a data acquisition server 312; a data processing server 314; and a data store server 316. The workstation 302 and each server 310, 312, 314, and 316 are connected to communicate with each other.

The pulse sequence server 310 functions in response to instructions downloaded from the workstation 302 to operate a gradient system 318 and a radiofrequency ("RF") system 320. Gradient waveforms necessary to perform the prescribed scan are produced and applied to the gradient system 318, which excites gradient coils in an assembly 322 to produce the magnetic field gradients $G_x$, $G_y$, and $G_z$ that are used for position encoding MR signals. The gradient coil assembly 322 forms part of a magnet assembly 324 that includes a polarizing magnet 326 and a whole-body RF coil 328.

RF excitation waveforms are applied to the RF coil 328, or a separate local coil (not shown in FIG. 3), by the RF system 320 to perform the prescribed magnetic resonance pulse sequence. Responsive MR signals detected by the RF coil 328, or a separate local coil (not shown in FIG. 3), are received by the RF system 320, amplified, demodulated, filtered, and digitized under direction of commands produced by the pulse sequence server 310. The RF system 320 includes an RF transmitter for producing a wide variety of RF pulses used in MR pulse sequences. The RF transmitter is responsive to the scan prescription and direction from the pulse sequence server 310 to produce RF pulses of the desired frequency, phase, and pulse amplitude waveform. The generated RF pulses may be applied to the whole body RF coil 328 or to one or more local coils or coil arrays (not shown in FIG. 3).

The RF system 320 also includes one or more RF receiver channels. Each RF receiver channel includes an RF amplifier that amplifies the MR signal received by the coil 328 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \quad (12);$$

and the phase of the received MR signal may also be determined:

$$\varphi = \tan^{-1}\left(\frac{Q}{I}\right). \quad (13)$$

The pulse sequence server 310 also optionally receives patient data from a physiological acquisition controller 330. The controller 330 receives signals from a number of different sensors connected to the patient, such as electrocardiograph ("ECG") signals from electrodes, or respiratory signals from a bellows or other respiratory monitoring device. Such signals typically may be used by the pulse sequence server 310 to synchronize, or "gate," the performance of the scan with the subject's heart beat or respiration.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized MR signal samples produced by the RF system 320 are received by the data acquisition server 312. The data acquisition server 312 operates in response to instructions downloaded from the workstation 302 to receive the real-time MR data and provide buffer storage, such that no data is lost by data overrun. In some scans, the data acquisition server 312 does little more than pass the acquired MR data to the data processor server 314. However, in scans that require information derived from acquired MR data to control the further performance of the scan, the data acquisition server 312 is programmed to produce such information and convey it to the pulse sequence server 310. For example, during prescans, MR data is acquired and used to calibrate the pulse sequence performed by the pulse sequence server 310. Also, navigator signals may be acquired during a scan and used to adjust the operating parameters of the RF system 320 or the gradient system 318, or to control the view order in which k-space is sampled. The data acquisition server 312 may also be employed to process MR signals used to detect the arrival of contrast agent in a dynamic contrast enhanced ("DCE") MRI scan. In this example, the data acquisition server 312 acquires MR data and processes it in real-time to produce information that may be used to control the scan.

The data processing server 314 receives MR data from the data acquisition server 312 and processes it in accordance with instructions downloaded from the workstation 302. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 314 are conveyed back to the workstation 302 where they are stored. Real-time images are stored in a data base memory cache (not shown in FIG. 3), from which they may be output to operator display 312 or a display 336 that is located near the magnet assembly 324 for use by attending physicians. Batch mode images or selected real time images are stored in a host database on disc storage 338. When such images have been reconstructed and transferred to storage, the data processing server 314 notifies the data store server 316 on the workstation 302. The workstation 302 may be used by an operator to archive the images, produce films, or send the images via a network to other facilities.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for automatically segmenting a three-dimensional image depicting a subject, the three-dimensional image being acquired with a magnetic resonance imaging (MRI) system, the steps of the method comprising:
    a) acquiring with the MRI system, image data from a subject;
    b) reconstructing from the image data acquired in step a), a three-dimensional image depicting the subject and a volume-of-interest to be segmented;
    c) producing from the three-dimensional image reconstructed in step b), a monogenic signal that represents the three-dimensional image;
    d) analyzing the monogenic signal produced in step c) to determine locations in the three-dimensional image that correspond to points of maximal phase congruency;
    e) determining an orientation of each of the points of maximal phase congruency determined in step d);
    f) estimating a surface of the volume-of-interest using the determined points of maximal phase congruency and the determined orientation of each of the points of maximal phase congruency;
    g) segmenting the volume-of-interest from the three-dimensional image using the estimated surface of the volume of interest.

2. The method as recited in claim 1 in which the volume-of-interest represents a breast of the subject.

3. The method as recited in claim 1 in which the three-dimensional image includes a plurality of spatially contiguous two-dimensional images.

4. The method as recited in claim 1 in which step c) includes convolving the three-dimensional image with a transform operator.

5. The method as recited in claim 4 in which the transform operator is a Riesz transform operator.

6. The method as recited in claim 4 in which step c) includes convolving the three-dimensional image with a bandpass filter before convolving the three-dimensional image with the transform operator.

7. The method as recited in claim 6 in which the bandpass filter is a log-Gabor filter.

8. The method as recited in claim 1 in which step d) includes calculating a local energy of the monogenic signal produced in step c) and determining the locations in the three-dimensional image that correspond to points of maximal phase congruency from the calculated local energy.

9. The method as recited in claim 8 in which the locations in the three-dimensional image that correspond to points of maximal phase congruency are selected as corresponding to points of maximal calculated local energy.

10. The method as recited in claim 1 in which step e) includes determining the orientation of each of the points of maximal phase congruency determined in step d) by analyzing a gradient of the three-dimensional image at the respective points of maximal phase congruency.

11. The method as recited in claim 10 in which step e) includes determining the orientation of each of the points of maximal phase congruency determined in step d) by estimating a scalar function having a Laplacian that equals a divergence of a vector field that includes point normals indicative of the orientation of each of the points of maximal phase congruency.

12. The method as recited in claim 10 in which step e) includes determining the orientation of each of the points of maximal phase congruency determined in step d) by:
    producing a phase congruency map that depicts values of phase congruency at each location in the three-dimensional image;
    thresholding the three-dimensional image to determine point normals indicative of the orientation of points of maximal phase congruency between some regions in the three-dimensional image; and
    thresholding the phase congruency map to determine point normals indicative of the orientation of points of maximal phase congruency between regions in the three-dimensional image having low contrast-to-noise ratio.

13. The method as recited in claim 1 in which step f) includes generating an isocontour using the determined points of maximal phase congruency and the determined orientation of each of the points of maximal phase congruency.

14. The method as recited in claim 13 in which step f) includes generating the isocontour using an adaptive marching cubes algorithm.

15. The method as recited in claim 1 in which step g) further includes refining the surface of the volume-of-interest estimated in step e) using an atlas containing a plurality of boundary surfaces generated for similar volumes-of-interest.

16. A method for automatically segmenting a volume-of-interest representative of a subject's breast from a medical image, the steps of the method comprising:
    a) providing an image acquired with a medical imaging system;

b) converting the image provided in step a) into a monogenic signal;

c) determining locations in the monogenic signal that correspond to locations in the image that have maximal phase congruency;

d) determining an orientation of each of the locations in the image having maximal phase congruency;

e) estimating a boundary surface of the volume-of-interest to be segmented using the locations in the image that have maximal phase congruency and the determined orientation of each of the locations in the image having maximal phase congruency; and f) segmenting the volume-of-interest from the image using the estimated boundary surface.

17. The method as recited in claim 16 in which the image includes at least one of a three-dimensional image and a plurality of spatially contiguous two-dimensional images.

18. The method as recited in claim 16 in which step b) includes convolving the image with a Riesz transform operator after convolving the image with a log-Gabor filter.

19. The method as recited in claim 16 in which step d) includes determining the orientation of each of the locations in the image having maximal phase congruency by estimating a scalar function having a Laplacian that equals a divergence of a vector field that includes point normals indicative of the orientation of each of the locations in the image having maximal phase congruency.

20. The method as recited in claim 16 in which step d) includes determining the orientation of each of the locations in the image having maximal phase congruency by:

produces a phase congruency map that depicts values of phase congruency at each location in the image;

thresholding the image to determine point normals indicative of orientation of each of the locations in the image having maximal phase congruency between some regions in the image; and thresholding the phase congruency map to determine point normals indicative of orientation of each of the locations in the image having maximal phase congruency between regions in the image having low contrast-to-noise ratio.

21. The method as recited in claim 16 in which the medical imaging system is at least one of a magnetic resonance imaging system, an x-ray computed tomography system, and an x-ray tomosynthesis system.

* * * * *